US012100769B2

(12) United States Patent
Okigawa (10) Patent No.: US 12,100,769 B2
(45) Date of Patent: Sep. 24, 2024

(54) SEMICONDUCTOR DEVICE (71) Applicant: FLOSFIA INC., Kyoto (JP)

(72) Inventor: Mitsuru Okigawa, Kyoto (JP)

(73) Assignee: FLOSFIA INC., Kyoto (JP)

( * ) Notice: Subject to any disclaimer, the term of this patent is extended or adjusted under 35 U.S.C. 154(b) by 299 days.

(21) Appl. No.: 17/613,346

(22) PCT Filed: May 22, 2020

(86) PCT No.: PCT/JP2020/020428
§ 371 (c)(1),
(2) Date: Nov. 22, 2021

(87) PCT Pub. No.: WO2020/235690
PCT Pub. Date: Nov. 26, 2020

(65) Prior Publication Data
US 2022/0223737 A1    Jul. 14, 2022

(30) Foreign Application Priority Data
May 23, 2019  (JP) ................................. 2019-097158

(51) Int. Cl.
*H01L 29/47* (2006.01)
*H01L 29/786* (2006.01)
*H01L 29/872* (2006.01)

(52) U.S. Cl.
CPC .......... *H01L 29/7869* (2013.01); *H01L 29/47* (2013.01); *H01L 29/872* (2013.01)

(58) Field of Classification Search
CPC .... H01L 29/47; H01L 29/7869; H01L 29/872
(Continued)

(56) References Cited

U.S. PATENT DOCUMENTS

2008/0142795 A1   6/2008 Ichinose et al.
2011/0133210 A1   6/2011 Horii et al.
(Continued)

FOREIGN PATENT DOCUMENTS

JP   2005-260101   9/2005
JP   2009-081468   4/2009
(Continued)

OTHER PUBLICATIONS

International Search Report issued Sep. 1, 2020 in International (PCT) Application No. PCT/JP2020/020428.
(Continued)

*Primary Examiner* — Monica D Harrison
(74) *Attorney, Agent, or Firm* — Wenderoth, Lind & Ponack, L.L.P.

(57) ABSTRACT

An object of the disclosure is to provide a semiconductor device with low-loss and suppressed leakage current, which is particularly useful for power devices. A semiconductor device including a semiconductor layer including an oxide semiconductor having a corundum structure as a main component, and a Schottky electrode including a first electrode layer and a second electrode layer having a higher conductivity than the first electrode layer, wherein an outer edge portion of the second electrode layer is electrically connected to the semiconductor layer at an electrical connection region through the first electrode layer, and an outer edge portion of the first electrode layer is located outside an outer edge portion of the electrical connection region.

12 Claims, 6 Drawing Sheets (58) Field of Classification Search
USPC .......................................................... 257/288
See application file for complete search history.

(56) References Cited

U.S. PATENT DOCUMENTS

| | | | | |
|---|---|---|---|---|
| 2015/0325660 | A1* | 11/2015 | Hitora | ..................... H01L 29/22 257/43 |
| 2016/0365421 | A1* | 12/2016 | Hasegawa | ......... H01L 21/28581 |
| 2017/0179249 | A1 | 6/2017 | Oda et al. | |
| 2017/0200790 | A1 | 7/2017 | Hitora et al. | |
| 2017/0221998 | A1 | 8/2017 | Ebihara et al. | |

FOREIGN PATENT DOCUMENTS

| | | |
|---|---|---|
| JP | WO2010/016388 | 2/2010 |
| JP | 2012-129299 | 7/2012 |
| JP | 2013-012760 | 1/2013 |
| JP | 2013-258251 | 12/2013 |
| JP | 2015-115373 | 6/2015 |
| JP | 2015-204331 | 11/2015 |
| JP | 2015-204334 | 11/2015 |
| JP | WO2015/166608 | 11/2015 |
| JP | WO2016/013554 | 1/2016 |
| JP | 2016-018900 | 2/2016 |
| JP | 2017-118039 | 6/2017 |
| JP | 2017-224794 | 12/2017 |
| JP | 2018-002544 | 1/2018 |
| JP | 2018-060992 | 4/2018 |
| JP | 2019-057569 | 4/2019 |

OTHER PUBLICATIONS

Jun Liang Zhao et al., "UV and Visible Electroluminescence From a Sn:$Ga_2O_3$/$n^+$-Si Heterojunction by Metal-Organic Chemical Vapor Deposition", IEEE Transactions on Electron Devices, vol. 58, No. 5, pp. 1447-1451, May 2011.

Kohei Sasaki et al., "Si-Ion Implantation Doping in $\beta$-$Ga_2O_3$ and Its Application to Fabrication of Low-Resistance Ohmic Contacts", Applied Physics Express 6 (2013) 086502, pp. 086502-1-086502-4.

Takahisa Ichinohe, "Silver Oxide Films Fabricated by Plasma Assisted Deposition", Vacuum and Surface Science, vol. 61, No. 3, pp. 172-176, https://doi.org/10.1380/vss.61.172, 2018, cited in CA and English Abstract.

Kazuaiki Akaiwa et al., "Conductivity control of Sn-doped $\alpha$-$Ga_2O_3$ thin films grown on sapphire substrates", Japanese Journal of Applied Physics, vol. 55, 1202BA, 2016, pp. 1202BA-1-1202BA-8, http://doi.org/10.7567/JJAP.55.1202BA.

* cited by examiner

SEMICONDUCTOR DEVICE

TECHNICAL FIELD

The disclosure relates to a semiconductor device applicable to power devices and the like.

BACKGROUND

Gallium oxide ($Ga_2O_3$) is a transparent semiconductor which has a wide band gap of 4.8-5.3 eV at room temperature and hardly absorbs visible and ultraviolet light. Therefore, it is particularly a promising material for use in optical devices, electronic devices and transparent electronics operating in the deep ultraviolet light region. In recent years, as disclosed in Non-Patent Document 1, photodetectors, light-emitting diodes (LEDs), and transistors using gallium oxide have been developed.

There are five crystalline structures of gallium oxide ($Ga_2O_3$), $\alpha$-type, $\beta$-type, $\gamma$-type, $\sigma$-type, and $\varepsilon$-type are known to exist, and $\beta$-$Ga_2O_3$ is generally the most stable structure. However, since $\beta$-$Ga_2O_3$ has a $\beta$-gallia structure, unlike the crystal systems generally used in electronic materials or the like, application in a semiconductor device is not always suitable. The growth of $\beta$-$Ga_2O_3$ thin films requires high substrate temperature and high vacuum degree, which also increases manufacturing costs. As disclosed in Non-Patent Document 2, $\beta$-$Ga_2O_3$ cannot be used as a donor only by using silicon (Si) dopants having a high concentration (e.g., $1\times10^{19}/cm^3$ or more), and cannot be used as a donor unless annealing treatment is performed at a high temperature of 800° C. to 1100° C. after ion implantation.

On the other hand, since $\alpha$-$Ga_2O_3$ has the same crystal structure as the sapphire substrate which has been widely provided, it is suitable for use in optical devices and electronic devices. Furthermore, $\alpha$-$Ga_2O_3$ is particularly useful for power devices due to its bandgap that is wider than that of $\beta$-$Ga_2O_3$. Therefore, a semiconductor device using $\alpha$-$Ga_2O_3$ as a semiconductor is desired.

Patent Documents 1 and 2 disclose a semiconductor device using $\beta$-$Ga_2O_3$ as a semiconductor, also using an electrode for obtaining ohmic properties conforming to $\beta$-$Ga_2O_3$ semiconductor, the electrode of two layers consisting of Ti and Au layers, the electrode of the three layers consisting of Ti, Al and Au layers, or the four layers consisting of Ti, Al, Ni and Au layers.

Patent Document 3 discloses a semiconductor device using $\beta$-$Ga_2O_3$ as a semiconductor, also using an electrode for obtaining Schottky properties conforming to $\beta$-$Ga_2O_3$ semiconductor, the electrode consisting of either Au layer, Pt layer, or a multilayer of Ni and Au layers.

However, in the case where the electrode disclosed in Patent Documents 1 to 3 is applied to a semiconductor device using $\alpha$-$Ga_2O_3$ as a semiconductor, the electrode does not function as a Schottky electrode or an ohmic electrode, or the semiconductor properties are degraded by the electrode to be peeled off from the semiconductor film. Furthermore, in the configuration of the electrode disclosed in Patent Documents 1 to 3, a leakage current is generated from the vicinity of an edge portion of the electrode for example, so that a semiconductor device that is practically satisfactory could not be obtained.

Patent Document 4 discloses a semiconductor device using $\alpha$-$Ga_2O_3$ as a semiconductor and having an electrode containing at least a metal selected from Groups 4 to 9 of the Periodic Table as a Schottky electrode. Note that Patent Document 4 is a patent application filed by the present applicant.

PRIOR TECHNICAL REFERENCE

Patent Literature

Patent Document 1: Japanese Patent Application Publication No. 2005-260101
Patent Document 2: Japanese Patent Application Publication No. 2009-081468
Patent Document 3: Japanese Patent Application Publication No. 2013-012760
Patent Document 4: Japanese Patent Application Publication No. 2018-060992

Non-Patent Literature

Non-Patent Document 1: Jun Liang Zhao et al, "UV and Visible Electroluminescence From a $Sn:Ga_2O_3/n^+$-Si Heterojunction by Metal-Organic Chemical Vapor Deposition", IEEE TRANSACTIONS ON ELECTRON DEVICES, VOL. 58, NO. 5 May 2011
Non-Patent Document 2: Kohei Sasaki et al, "Si-Ion Implantation Doping in $\beta$-$Ga_2O_3$ and Its Application to Fabrication of Low-Resistance Ohmic Contacts", Applied Physics Express 6 (2013) 086502

SUMMARY

Technical Problem

An object of the disclosure is to provide a semiconductor device with low-loss and suppressed leakage current.

Solution to Problem

As a result of intensive studies to achieve the above object, inventors provide a semiconductor device including a semiconductor layer including an oxide semiconductor having a corundum structure as a main component, and a Schottky electrode including a first electrode layer and a second electrode layer having a higher conductivity than the first electrode layer, wherein an outer edge portion of the second electrode layer is electrically connected to the semiconductor layer at an electrical connection region through the first electrode layer, and an outer edge portion of the first electrode layer is located outside an outer edge portion of the electrical connection region. Such semiconductor device was found to extend the depletion layer in the semiconductor layer favorably, and was with low-loss and suppressed leakage current. The semiconductor device thus provided can solve the above-described problems.

After the above findings, the inventors have made further research and reach the disclosure.

Embodiments of the disclosure are as follows.

[1] A semiconductor device including a semiconductor layer including an oxide semiconductor having a corundum structure as a main component, and a Schottky electrode including a first electrode layer and a second electrode layer having a higher conductivity than the first electrode layer, wherein an outer edge portion of the second electrode layer is electrically connected to the semiconductor layer at an electrical connection region through the first electrode layer, and an outer edge portion of the first electrode layer is located outside an outer edge portion of the electrical connection region.

[2] The semiconductor device according to [1], wherein the oxide semiconductor contains at least one metal selected from aluminum, indium and gallium.

[3] The semiconductor device according to [1] or [2], wherein the oxide semiconductors contain at least gallium.

[4] The semiconductor device according to any of [1] to [3], wherein the first electrode layer contains at least one metal selected from Groups 4 to 10 of the Periodic Table.

[5] The semiconductor device according to any one of [1] to [4], wherein the first electrode layer contains at least one metal selected from Groups 4 and 9 of the Periodic Table.

[6] The semiconductor device according to any one of [1] to [5], wherein the first electrode layer includes at least two layers and wherein the two layers have different compositions from each other.

[7] The semiconductor device according to any one of [1] to [6], wherein at least a part of a portion of the first electrode layer protruding outward from the outer edge portion of the second electrode layer has a tapered region in which a thickness of the first electrode layer decreases toward an outer side of the semiconductor device.

[8] The semiconductor device according to any one of [1] to [7], wherein the second electrode layer contains at least one metal selected from silver, copper, gold and aluminum.

[9] The semiconductor device according to any of [1] to [8], wherein a thickness of the first electrode layer is thinner than a thickness of the second electrode layer.

[10] The semiconductor device according to any of [1] to [9], further including a field insulating film on which the outer edge portion of the first electrode layer is located.

[11] The semiconductor device according to any one of [1] to [10], wherein the semiconductor device includes a Schottky barrier diode.

[12] The semiconductor device according to any one of [1] to [11], wherein the semiconductor device includes a power device.

[13] A semiconductor system employing the semiconductor device according to any one of [1] to [12].

Advantageous Effect of Invention

According to the disclosure, a semiconductor device with low-loss and suppressed leakage current is provided.

DESCRIPTION OF EMBODIMENT

The semiconductor device of the disclosure including a semiconductor layer including an oxide semiconductor having a corundum structure as a main component, and a Schottky electrode including a first electrode layer and a second electrode layer having a higher conductivity than the first electrode layer, wherein an outer edge portion of the second electrode layer is electrically connected to the semiconductor layer at an electrical connection region through the first electrode layer, and an outer edge portion of the first electrode layer is located outside an outer edge portion of the electrical connection region. Note that the term "electrical connection" includes in a state of direct electrical connection, and also includes in a state of indirect electrical connection having a conductive film, a semiconductor film or the like located therebetween. The outer edge portion of the electrical connection region may be an outer edge portion of the second electrode layer, or may be an outer edge portion of a region in the second electrode layer that is electrically connected to the first electrode layer. Hereinafter, the "outer edge portion of the second electrode layer" will be explained as an example of the "outer edge portion of the electrical connection region." However, the disclosure is not limited to these examples.

The semiconductor layer is not particularly limited as long as it contains an oxide semiconductor having a corundum structure as a main component. Examples of the oxide semiconductor having the corundum structure include a metal oxide and the like containing one or more metals selected from aluminum, gallium, indium, iron, chromium, vanadium, titanium, rhodium, nickel, cobalt, and iridium. In the disclosure, the oxide semiconductor preferably contains at least one metal selected from aluminum, indium, and gallium, and more preferably, the oxide semiconductor contains at least gallium, and most preferably, the oxide semiconductor contains $\alpha$-$Ga_2O_3$ or a mixed crystal thereof. Note that the term "main component" means that the atomic ratio of the oxide semiconductor having the corundum structure relative to all components of the semiconductor layer is preferably 50% or more, more preferably 70% or more, and still more preferably 90% or more, and may be 100%. Thickness of the semiconductor layer is not particularly limited, and may be 1 µm or less, and may be 1 µm or more. In the disclosure, the thickness of the semiconductor layer is preferable 10 μm or more. Surface area of the semiconductor film is not particularly limited, and may be 1 mm² or more, or 1 mm² or less. In the disclosure, the surface area of the semiconductor film is preferably 10 mm² to 300 cm², and more preferably 100 mm² to 100 cm². The semiconductor layer is typically of a single crystal, but may be of polycrystalline. The semiconductor layer is a multilayer film including at least a first semiconductor layer and a second semiconductor layer. When the Schottky electrode is provided on the first semiconductor layer of the multilayer film, it is preferable that the carrier density of the first semiconductor layer is smaller than the carrier density of the second semiconductor layer. In this case, the second semiconductor layer typically contains a dopant, and the carrier density of the semiconductor layer can be appropriately set by adjusting the doping amount.

The semiconductor layer preferably contains a dopant. Material for the dopant is not particularly limited and known dopant materials may be applied. Examples of the dopant include n-type dopants such as tin, germanium, silicon, titanium, zirconium, vanadium or niobium, or p-type dopants such as magnesium, calcium, and zinc. In the disclosure, it is preferred that the n-type dopant is tin, germanium or silicon. Content of the dopant in the composition of the semiconductor layer is preferable 0.00001 atomic % or more, more preferably 0.00001 atomic % to 20 atomic %, and most preferably 0.00001 atomic % to 10 atomic %. More specifically, the concentration of the dopant in the semiconductor layer may typically be about $1\times10^{16}/cm^3$ to $1\times10^{22}/cm^3$, or the concentration of the dopant in the semiconductor layer may be as low as, for example, about $1\times10^{17}/cm^3$ or less. Further, in the disclosure, the semiconductor layer may contain dopants at high concentrations of about $1\times10^{20}/cm^3$ or more. In the disclosure, it is preferable that the semiconductor layer may contain a dopant at a dopant concentration of $1\times10^{17}/cm^3$ or more.

Figure 5:
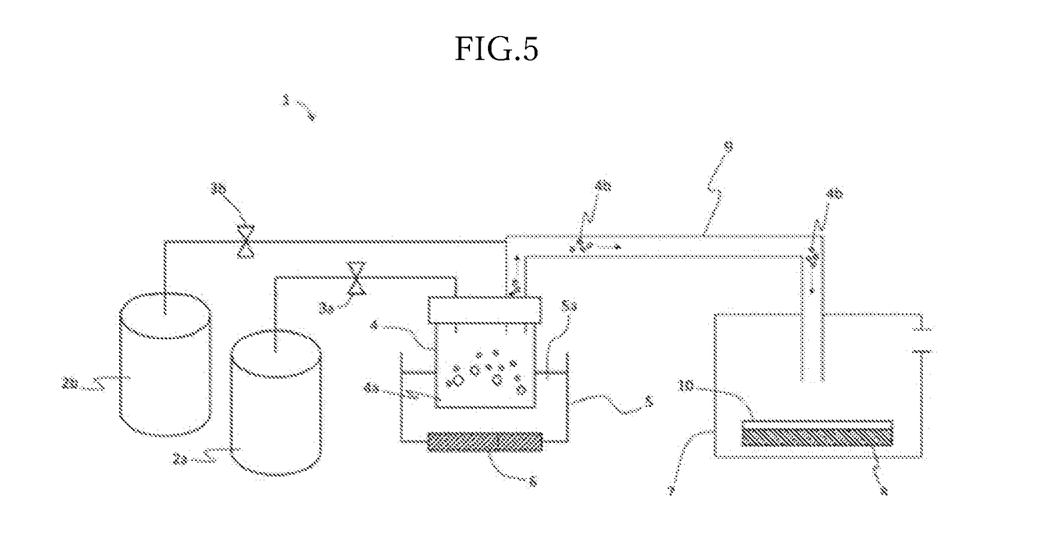
FIG. 5 is a block diagram illustrating a mist CVD apparatus used for a semiconductor device according to one or more embodiments of the disclosure.

The semiconductor layer may be formed by using a known method. Examples of the method for forming the semiconductor layer includes a CVD method, a MOCVD method, a MOVPE method, a mist-CVD method, a mist-epitaxy method, a MBE method, a pulsed growth method, an ALD method, and the like. In the disclosure, the method of forming the semiconductor layer is preferably mist CVD method or mist epitaxy method. In the mist CVD method or the mist epitaxy method, for example, a mist CVD apparatus shown in FIG. 5 is used to atomize a raw material solution to float droplets (atomizing step), and thereafter, atomized droplets are conveyed to the vicinity of a substrate by a carrier gas (conveying step), and then the atomized droplets are thermally reacted in the vicinity of the substrate, whereby a semiconductor film containing a crystalline oxide semiconductor as a main component is deposited on the substrate and the semiconductor layer is formed (deposition step) on the substrate.

(Atomizing Step)

In the atomizing step, the raw material solution is atomized. The method of atomizing the raw material solution is not particularly limited as long as the raw material solution can be atomized, and may be a known method. In the disclosure, ultrasonic waves are preferably used as an atomizing method. Droplets atomized using ultrasonic waves are preferred because they have an initial velocity of zero and are floated in the air. The droplet can be conveyed as a gas by floating in a space instead of being sprayed like a spray. It is very preferable because of no damage by collision energy. The size of the droplet is not particularly limited, and may be a droplet of about several millimeters, preferably 50 μm or less, and more preferably 100 nm to 10 μm.

(Raw Material Solution)

The raw material solution is not particularly limited as long as it is capable of atomization or droplet formation and contains a raw material capable of forming the semiconductor film. The raw material may be an inorganic material or an organic material.

In the disclosure, the raw material is preferably a metal or a metal compound, and more preferably includes one or more metals selected from aluminum, gallium, indium, iron, chromium, vanadium, titanium, rhodium, nickel, cobalt and iridium.

In the disclosure, it is preferable to use a material in which the metal is dissolved or dispersed in an organic solvent or water in the form of a complex or a salt as the raw material solution. Examples of the form of the complex include acetylacetonate complex, carbonyl complex, ammine complex, hydride complex, and the like. Examples of the form of the salt include organometallic salt (metal acetate, metal oxalate, metal citrate, and the like), metal sulfide salt, nitrified metal salt, phosphorylated metal salt, and halogenated metal salt (metal chloride, metal bromide, metal iodide, and the like).

In the raw material solution, it is preferable to mix an additive such as hydrohalic acid or oxidizing agent. Examples of the hydrohalic acid include hydrobromic acid, hydrochloric acid, and hydroiodic acid. For the reason that the occurrence of abnormal grains can be more efficiently suppressed, hydrobromic acid or hydroiodic acid is more preferable. Examples of the oxidizing agent include peroxide such as hydrogen peroxide ($H_2O_2$), sodium peroxide ($Na_2O_2$), barium peroxide ($BaO_2$), benzoyl peroxide (peroxide such as $C_6H_5CO)_2O_2$), and organic peroxides such as hypochlorous acid (HClO), perchloric acid, nitric acid, ozone water, peracetic acid and nitrobenzene.

A dopant may be contained in the raw material solution. By including a dopant in the raw material solution, doping can be favorably performed. Material for the dopant is not particularly limited as long as it does not deviate the object of the disclosure. Examples of the dopant include an n-type dopant such as tin, germanium, silicon, titanium, zirconium, vanadium, or niobium, or a p-type dopant such as Mg, H, Li, Na, K, Rb, Cs, Fr, Be, Ca, Sr, Ba, Ra, Mn, Fe, Co, Ni, Pd, Cu, Ag, Au, Zn, Cd, Hg, Ti, Pb, N, or P. The content of the dopant is appropriately set by referring to a calibration curve showing the relationship of the concentration of the dopant in the raw material with respect to the desired carrier density.

The solvent of the raw material solution is not particularly limited, and may be inorganic solvent such as water, organic solvent such as alcohol, or mixed solvent of inorganic solvent and organic solvent. In the disclosure, it is preferable that the solvent contains water, and more preferably, the solvent is water or a mixed solvent of water and alcohol.

(Conveying Step)

In the conveying step, the atomized droplets are conveyed into a deposition chamber using a carrier gas. The carrier gas is not particularly limited as long as it does not deviate the object of the disclosure, and examples thereof include an inert gas such as oxygen, ozone, nitrogen or argon, or a reducing gas such as hydrogen gas or a forming gas. The type of the carrier gas may be one, and two or more types may be accepted. Dilution gas (such as 10-fold dilution gas) having reduced flow rate may be further applied as the second carrier gas. The carrier gas may be supplied not only at one point but also at two or more points in the deposition chamber. Flow rate of the carrier gas is not particularly limited, and is preferably 0.01 to 20 L/min, more preferably 1 to 10 L/min. When dilution gas is used, the flow rate of the dilution gas is preferably 0.001 to 2 L/min, more preferably 0.1 to 1 L/min.

(Deposition Step)

In the deposition step, the semiconductor film is deposited on the base by thermally reacting the atomized droplets in the vicinity of the base. The thermal reaction may be performed so long as the atomized droplets react with heat, and the reaction conditions and the like are not particularly limited as long as they do not deviate the object of the disclosure. In this deposition step, the thermal reaction is generally performed at a temperature equal to or higher than an evaporation temperature of the solvent, and in that case, temperature (e.g., 1000° C. or less) which is not too high is preferable, and more preferably 650° C. or less, and most preferably 300° C. to 650° C. The thermal reaction may be performed either under a vacuum, under a non-oxygen atmosphere (under an inert gas atmosphere or the like), under a reducing gas atmosphere and under an oxygen atmosphere as long as it does not deviate the object of the disclosure, and is preferably performed under an inert gas atmosphere or under an oxygen atmosphere. The deposition step may be performed under any condition under atmospheric pressure, under pressure and under reduced pressure, and is preferably performed under atmospheric pressure in the disclosure. The film thickness can be set by adjusting the deposition time.

(Base)

A base is not particularly limited as long as the base can support the semiconductor film. The material of the base is not particularly limited as long as it does not deviate the object of the disclosure, and may be a known base. The base may be an organic compound or an inorganic compound. The shape of the base may be of any shape, for example, a plate such as a flat plate or a disc plate, fibrous, rodlike, column, prismatic, cylindrical, spiral, spherical, and ring-shaped. In the disclosure, the base is preferably a substrate. Thickness of the substrate is not particularly limited in the disclosure.

The substrate is not particularly limited as long as the substrate is in the shape of plate and can support the semiconductor film. The substrate may be an insulator substrate, a semiconductor substrate, a metal substrate, or a conductive substrate. The substrate is preferably the insulator substrate, and is also preferable to have a metal film on its surface. Examples of the substrate include a base substrate containing a substrate material having corundum structure as a main component, a base substrate containing a substrate material having β-gallia structure as a main component, and a base substrate containing a substrate material having hexagonal crystal structure as a main component. Here, the term "main component" means that the atomic ratio of the substrate material having the specific crystal structure to all components of the material constituting the substrate is preferably 50% or more, more preferably 70% or more, and still more preferably 90% or more, and may be 100%.

Material for the substrate is not particularly limited as long as it does not deviate the object of the disclosure, and may be a known one. As the substrate having the corundum structure, it is preferable to employ a α-$Al_2O_3$ (sapphire) substrate or a α-$Ga_2O_3$ substrate, and more preferably an α-plane sapphire substrate, an m-plane sapphire substrate, an r-plane sapphire substrate, a c-plane sapphire substrate, or an α-type gallium oxide substrate (a-plane, m-plane, or r-plane). As the base substrate containing the β-gallia-structured substrate material as a main component, a β-$Ga_2O_3$ substrate, or a mixed crystal substrate containing $Ga_2O_3$ and $Al_2O_3$ in which $Al_2O_3$ is more than 0 wt % and 60 wt % or less may be selected for example. Examples of the base substrate containing the hexagonal-structured substrate material as a main component include a SiC substrate, a ZnO substrate and a GaN substrate.

In the disclosure, annealing treatment may be performed after the deposition step. Temperature of the aforementioned annealing treatment is not limited especially unless deviating the object of the disclosure, and is generally 300° C. to 650° C., and is preferably 350° C. to 550° C. Processing time of the annealing treatment is generally in 1 minutes to 48 hours, preferably in 10 minutes to 24 hours, and more preferably in 30 minutes to 12 hours. The annealing treatment may be performed under any atmosphere so long as it does not deviate the object of the disclosure. The atmosphere of the annealing treatment may be a non-oxygen atmosphere or an oxygen atmosphere. Examples of the non-oxygen atmosphere include an inert gas atmosphere (e.g., a nitrogen atmosphere) or a reducing gas atmosphere. In the disclosure, the non-oxygen atmosphere is preferably the inert gas atmosphere, more preferably the nitrogen atmosphere.

In the disclosure, the semiconductor film may be deposited directly on the base, or the semiconductor film may be deposited via another layer such as a stress relaxation layer (a buffer layer, an ELO layer, or the like), a release sacrifice layer, or the like. Method of forming each of the layers is not particularly limited, and may be a known method. In the disclosure, a method of forming each of the layers is preferably a mist CVD method.

In the present disclosure, the semiconductor film may be used in a semiconductor device as the semiconductor layer after the semiconductor film is peeled off from the base or the like by a known method, or the semiconductor film may be used in a semiconductor device as the semiconductor layer without being peeled off from the base or the like.

The first electrode layer is not particularly limited as long as it has conductivity that is lower than that of the second electrode layer and does not deviate the object of the disclosure. Constituent material of the first electrode layer may be a conductive inorganic material or a conductive organic material. In the disclosure, it is preferable that the material of the first electrode is a metal. Preferable examples of the metal include at least one metal selected from Groups 4 to 10 of the Periodic Table. Examples of the metal of Group 4 of the Periodic Table include titanium (Ti), zirconium (Zr), and hafnium (Hf). Examples of the metal of Group 5 of the Periodic Table include vanadium (V), niobium (Nb), and tantalum (Ta). Examples of the metal of Group 6 of the Periodic Table include chromium (Cr), molybdenum (Mo) and tungsten (W). Examples of the metal of Group 7 of the Periodic Table include manganese (Mn), technetium (Tc), and rhenium (Re). Examples of the metal of Group 8 of the Periodic Table include iron (Fe), ruthenium (Ru), and osmium (Os). Examples of the metal of Group 9 of the Periodic Table include cobalt (Co), rhodium (Rh), and iridium (Ir). Examples of the metal of Group 10 of the Periodic Table include nickel (Ni), palladium (Pd), and platinum (Pt). In the disclosure, it is preferable that the first electrode layer contains at least one metal selected from Groups 4 and 9 of the Periodic Table, and more preferably, a metal selected from Group 9 of the Periodic Table. Thickness of the first electrode layer is not particularly limited, and is preferably 0.1 nm to 10 μm, more preferably 5 nm to 500 nm, and most preferably 10 nm to 200 nm. In the disclosure, it is preferable that the thickness of the first electrode layer is thinner than the thickness of the second electrode layer. In the disclosure, it is preferable that the first electrode layer is composed of at least two layers and wherein the two layers have different compositions from each other. By such a preferred configuration of the first electrode layer, it is possible to obtain a semiconductor device with enhanced Schottky characteristics, and to effectively suppress the leakage current.

The second electrode layer is not particularly limited as long as it has conductivity that is higher than that of the first electrode layer and does not deviate the object of the disclosure. Constituent material of the second electrode layer may be a conductive inorganic material or a conductive organic material. In the disclosure, it is preferable that the material of the second electrode is a metal. Preferable examples of the metal include at least one metal selected from Groups 8 to 13 of the Periodic Table. Examples of preferred metals of Groups 8 to 10 of the Periodic Table include the metals exemplified as the metals of Groups 8 to 10 of the Periodic Table in the above description of the first electrode layer. Examples of the metal of Group 11 of the Periodic Table include copper (Cu), silver (Ag), and gold (Au). Examples of the metal of Group 12 of the Periodic Table include zinc (Zn) and cadmium (Cd). Examples of the metal of Group 13 of the periodic table include aluminum (Al), gallium (Ga), and indium (In). In the disclosure, it is preferable that the second electrode layer contains at least one metal selected from Groups 11 and 13 of the Periodic Table, and more preferably contains at least one metal selected from silver, copper, gold and aluminum. The thickness of the second electrode layer is not particularly limited, and is preferably 1 nm to 500 µm, more preferably 10 nm to 100 µm, and most preferably 0.5 µm to 10 µm.

The method of forming the first electrode layer or the second electrode layer is not particularly limited, and may be a known method. Specific examples of the method of forming the first electrode or the second electrode layer include a dry method and a wet method. Examples of the dry method include sputtering, vacuum evaporation, and CVD. Examples of the wet method include screen printing and die coating.

The outer edge portion of the first electrode layer may be located outside the outer edge portion of the second electrode layer. In the disclosure, the leakage current can be effectively suppressed by setting the distance between the outer edge portion of the first electrode layer and the outer edge portion of the second electrode layer to 1 µm or more. In the disclosure, a portion of the first electrode layer protruding outward from the outer edge portion of the second electrode layer (hereinafter also referred to as "protruding portion") may, at least partially, have a tapered region in which thickness of the first electrode layer decreases toward the outer side of the semiconductor device. It makes possible to further improve breakdown voltage of the semiconductor device. By combining such an electrode configuration and the constituent material of the semiconductor layer described above, a semiconductor device having a lower loss with the leakage current being favorably suppressed is provided. The rate of change of the layer thickness in the tapered region is not particularly limited. When it can be said that the layer thickness of the tapered region decreases toward the outside of semiconductor device from arbitrary two points of the inner film thickness and the outer film thickness, the region may be regarded as the tapered region for convenience.

In the disclosure, it is also preferable to further include a field insulating film on the semiconductor layer. In this case, when the outer edge portion of the first electrode layer is located on the field insulating film, the depletion layer is favorably formed in the semiconductor layer. The constituent material of the field insulating film is not particularly limited as long as it does not deviate the object of the disclosure, and may be a known material. Examples of the field insulating film include a $SiO_2$ film, a polysilicon film, a $SiO_2$ film with phosphorus added (PSG film), a $SiO_2$ film with boron added, and a BPSG film with phosphorus and boron added. Examples of the method for forming the field insulating film include a CVD method, an atmospheric pressure CVD method, a plasma CVD method, a mist CVD method, and a thermal oxidation method. In the disclosure, the method of forming the field insulating film is preferably a mist CVD method or an atmospheric pressure CVD method.

Hereinafter, preferred embodiments of the semiconductor device will be described in more detail with reference to the drawings. Note that the disclosure is not limited to the following embodiments.

Figure 1:
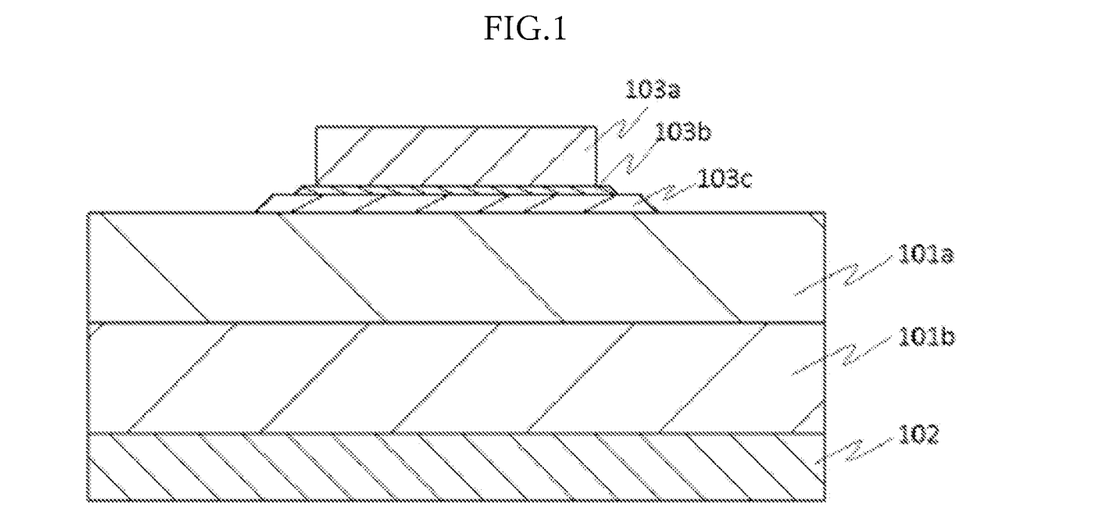
FIG. 1 is a cross-sectional view schematically illustrating a Schottky barrier diode (SBD) according to one or more preferred embodiments of a semiconductor device of the disclosure.

FIG. 1 is a cross-sectional view illustrating a main part of a Schottky barrier diode (SBD) as one of the preferred embodiments of the semiconductor device of the disclosure. The SBD shown in FIG. 1 includes an ohmic electrode 102, an $n^-$-type semiconductor layer 101a, an $n^+$-type semiconductor layer 101b, and a Schottky electrode 103. The Schottky electrode 103 includes metal layers 103a, 103b and 103c. In the semiconductor device shown in FIG. 1, the outer edge portion of the metal layer 103b and/or the metal layer 103c serving as the first electrode layer is located outside the outer edge portion of the metal layer 103a serving as the second electrode layer. It makes possible to suppress leakage current more favorably. Further, of the metal layer 103b and/or the metal layer 103c, the thickness of the portion protruding outward from the outer edge of the metal layer 103a has a tapered region which decreases toward the outer side of the semiconductor device. Therefore, the structure thereof provides an enhanced breakdown voltage.

Examples of the material constituting the metal layer 103a include the above-described metals exemplified as materials constituting the second electrode layer. Examples of materials constituting the metal layers 103b and 103c include the above-mentioned metals exemplified as materials constituting the first electrode layer. The method of forming each layer shown in FIG. 1 is not particularly limited as long as it does not deviate the object of the disclosure, and may be a known method. Patterning by a photolithography method after deposition using a vacuum deposition method, a CVD method, a sputtering method or various coating methods, or by a method of performing direct patterning using a printing technique or the like may be employed.

Figure 2:
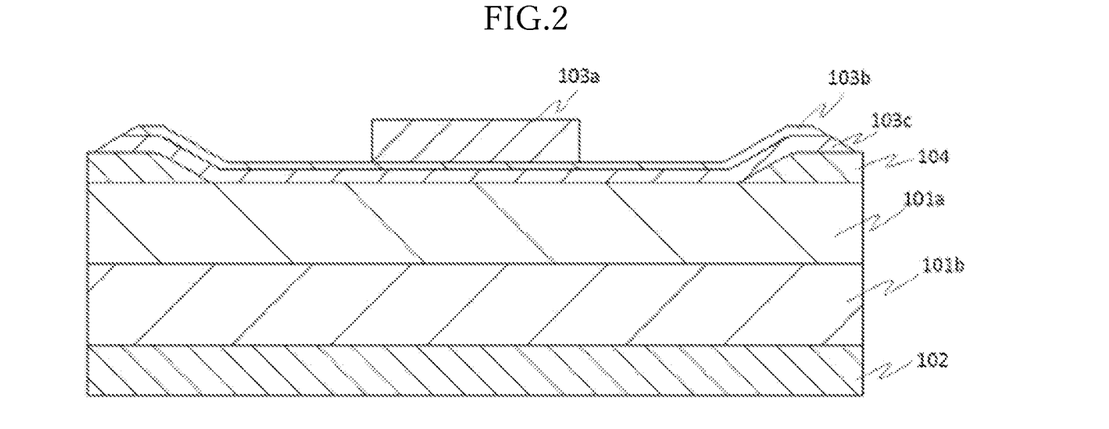
FIG. 2 is a cross-sectional view schematically illustrating a Schottky barrier diode (SBD) according to one or more preferred embodiments of a semiconductor device of the disclosure.

FIG. 2 is a cross-sectional view illustrating a main part of a Schottky barrier diode (SBD) as one of other preferred embodiments of the semiconductor device of the disclosure. The SBD shown in FIG. 2 is different from the SBD shown in FIG. 1 such that the SBD further includes a field insulating film 104, and the outer edge portions of the metal layer 103b and/or the metal layer 103c are located on the field insulating film 104. With such a configuration, it makes possible to further improve the breakdown voltage of the semiconductor device.

The method of forming each layer shown in FIG. 2 is not particularly limited as long as it does not deviate the object of the disclosure, and may be a known method. Patterning by a photolithography method after deposition using a vacuum deposition method, a CVD method, a sputtering method or various coating methods, or by a method of performing direct patterning using a printing technique or the like may be employed.

In the following, the disclosure will be described in more detail with reference to preferred embodiments for manufacturing the semiconductor device illustrated in FIG. 2.

Figure 3:
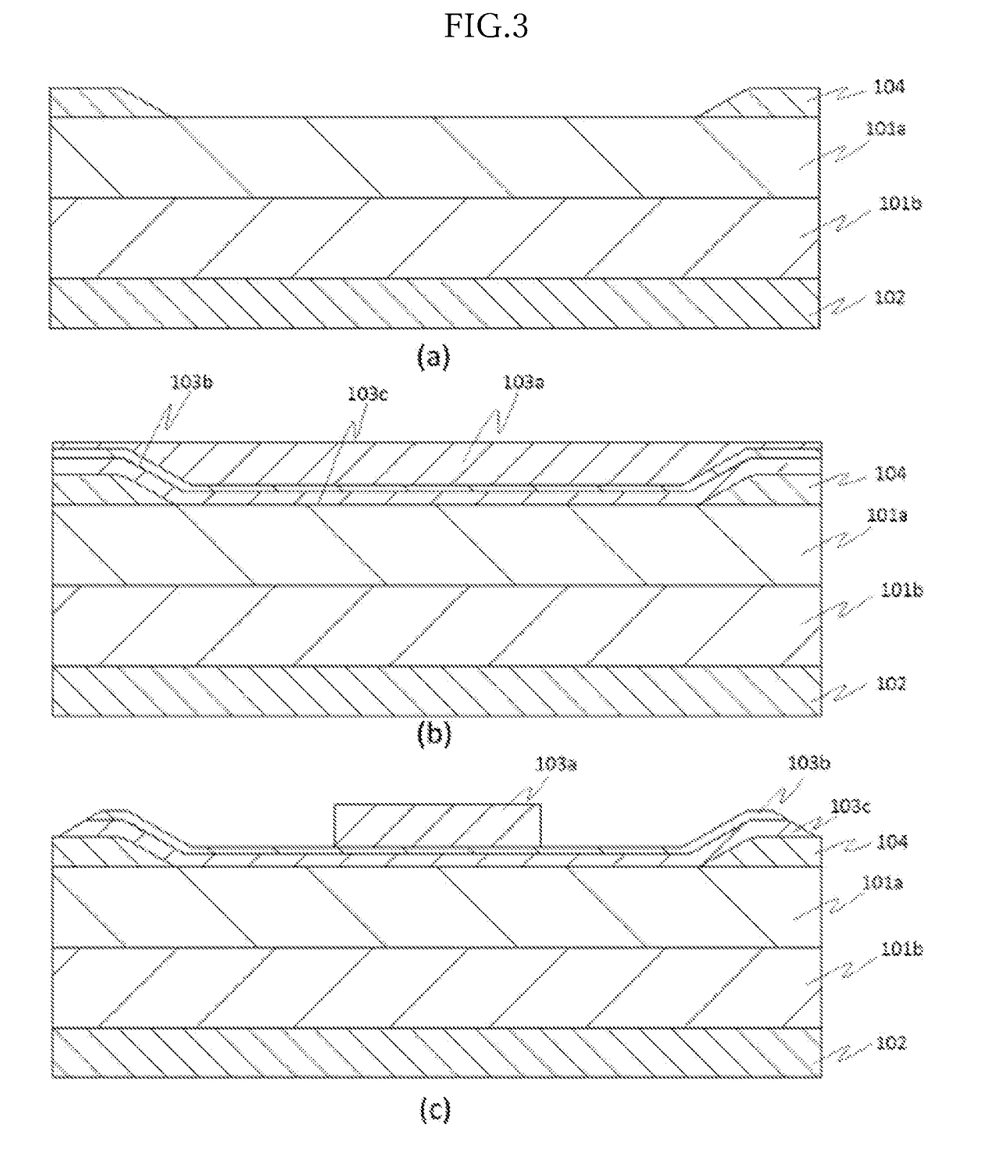
FIG. 3 is a cross-sectional view schematically illustrating a Schottky barrier diode (SBD) according to one or more preferred embodiments of a semiconductor device of the disclosure.

FIG. 3A shows a multilayer in which the n$^+$-type semiconductor layer 101b and the n$^-$-type semiconductor layer 101a are formed in this order on the ohmic electrode 102, and the field insulating film 104 is formed on the n$^-$-type semiconductor layer. The method of forming the field insulating film 104 is not particularly limited as long as it does not deviate the object of the disclosure. Examples of the method for forming the field insulating film 104 include a sputtering method, a vacuum deposition method, a coating method, a CVD method, an atmospheric pressure CVD method, a plasma CVD method, a mist CVD method, and a thermal oxidation method. In the disclosure, a mist CVD method or an atmospheric pressure CVD method is preferable. In the field insulating film 104, an opening for the first electrode layer is formed to expose at least a part of the n$^-$-type semiconductor layer 101a. The method for forming the opening is not particularly limited, and may be a known etching method. A tapered portion is formed in the field insulating film 104 such that thickness thereof decreases from the outside to the inside of the semiconductor device. The method of forming the tapered portion is not particularly limited as long as it does not deviate the object of the disclosure, and may be a known method.

Next, the metal layers 103b, 103b and 103c are formed on the multilayer of FIG. 3A by using the dry method or the wet method to obtain the multilayer of FIG. 3B. Thereafter, unnecessary portions of the metal layer 103a, 103b and 103c are removed using a known etch technique to obtain the multilayer of FIG. 3C. It is preferable, by the etching step is made while the resist is retreated, for example, the outer edge portion of the first electrode is formed to be a tapered shape. The semiconductor device thus obtained provides suppressed leakage current and excellent breakdown voltage.

Figure 4:
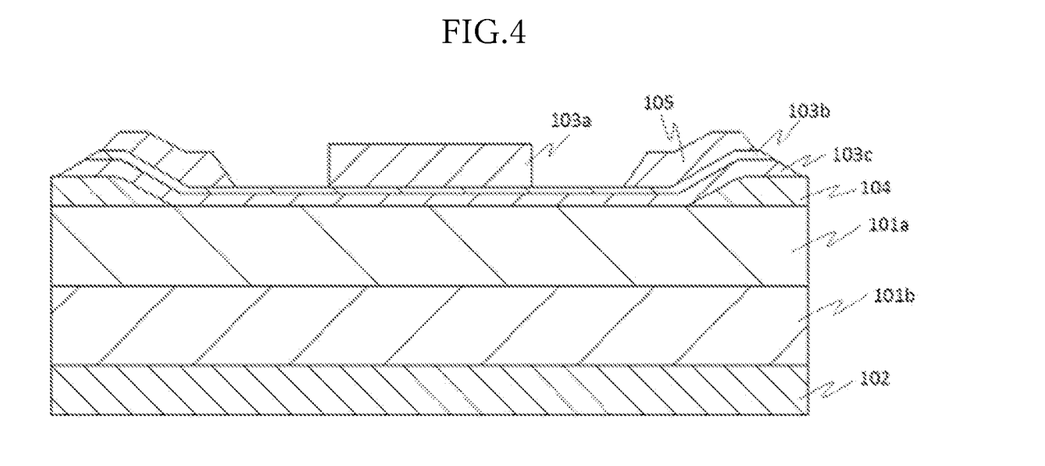
FIG. 4 is a cross-sectional view schematically illustrating a Schottky barrier diode (SBD) according to one or more preferred embodiments of a semiconductor device of the disclosure.

FIG. 4 is a cross-sectional view illustrating a main part of a Schottky barrier diode (SBD) as another preferred embodiment of the disclosure. The SBD shown in FIG. 4 is different from the SBD of FIG. 2 such that a protective metal layer 105 is further provided around the outer edge portion of the first metal layer. The protective metal layer 105 is provided so as to cover at least an edge portion of the field insulating film 104. The constituent material of the protective metal layer 105 is not particularly limited, and may be the same as that of the metal exemplified as material as the metal layers 103a, 103b and 103c. With such a configuration, the metal layer 103a, 103b and 103c can be formed more efficiently, and the reliability of the semiconductor device can be further improved while the characteristics of breakdown voltage are further improved.

The method of forming each layer shown in FIG. 4 is not particularly limited as long as it does not deviate the object of the disclosure, and may be a known method. Patterning by a photolithography method after deposition using a vacuum deposition method, a CVD method, a sputtering method or various coating methods, or by a method of performing direct patterning using a printing technique or the like may be employed.

The semiconductor device according to one or more embodiments of the disclosure is particularly useful for power devices. As the semiconductor device, a diode (PN diode, Schottky barrier diode, junction barrier Schottky diode, etc.) or a transistor (such as a MOSFET, MESFET) and the like are given as examples. Among them, a diode is preferable, and Schottky barrier diode (SBD) is more preferable.

Figure 6:
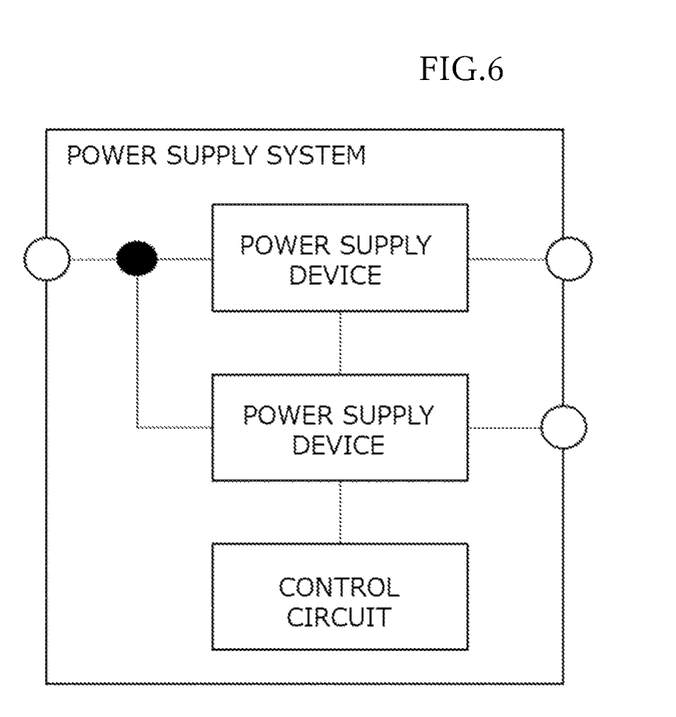
FIG. 6 is a diagram schematically illustrating a power supply system employing a semiconductor device according to one or more preferred embodiments of the disclosure.
Figure 7:
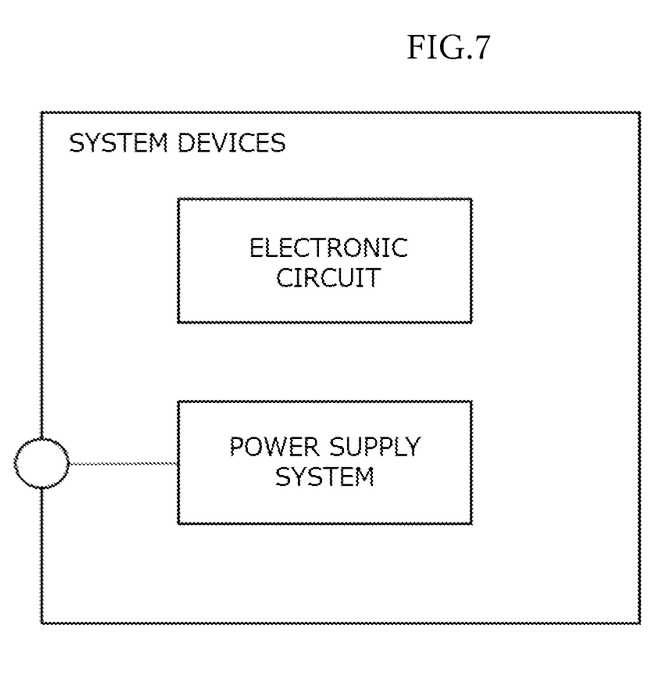
FIG. 7 is a diagram schematically illustrating a system device employing a semiconductor device according to one or more preferred embodiments of the disclosure.
Figure 8:
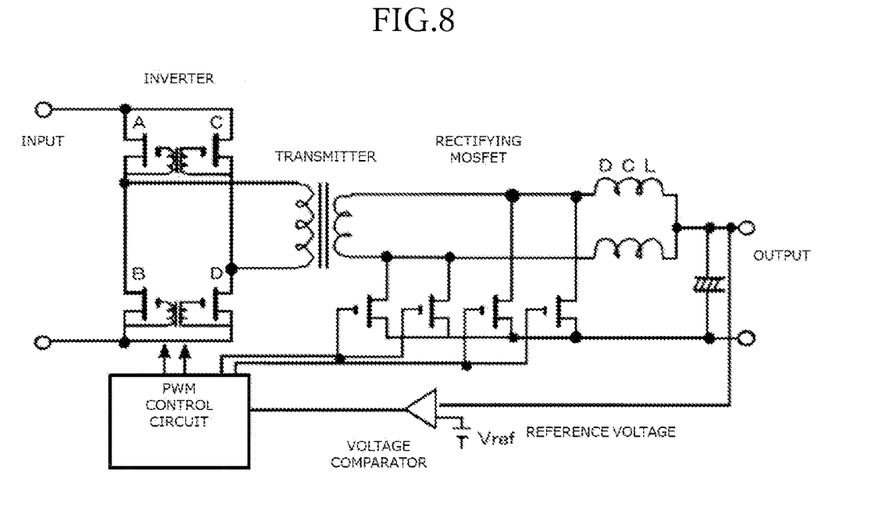
FIG. 8 is a circuit diagram illustrating a power supply a power supply device employing a semiconductor device according to one or more preferred embodiments of the disclosure.

The disclosed semiconductor device is not limited to above explained embodiments and can be suitably used as power modules, inverters or converters using known methods. The power modules, inverters and converters are also included in the semiconductor device of the disclosure. Further, the semiconductor device of the disclosure is suitable for use in semiconductor systems and the like using a power supply device. The power supply device can be manufactured with or as the semiconductor device by connecting the power supply device to wiring patterns by known methods. FIG. 6 shows an example of a power supply system configured by a plurality of the power supply device and a control circuit. As shown in FIG. 7, the power supply system can be used to system device by combining with electronic circuit. FIG. 8 shows a power supply of the power supply device including a power circuit and a control circuit. In the power supply, an input DC voltage is converted to AC voltage by high-frequency switching by an inverter (constituted by MOSFETs A to D), and insulated and transformed by a transformer, rectified by a rectifying MOSFETs A to B', and then smoothed by a DCL (smoothing coils L1 and L2) and a capacitor to generate an output DC voltage. Further, the output voltage and a reference voltage are compared by a voltage comparator so that the inverters and the rectifying MOSFETs are controlled by a PWM control circuit to generate the output DC voltage to be a desired value.

EMBODIMENT

Hereinafter, examples of the embodiments will be described. The disclosure is not limited to these examples.

Example 1

1. Formation of an n$^-$-Type Semiconductor Layer
1-1. Deposition Apparatus

With reference to FIG. 5, a mist CVD apparatus used in this example will be described. A mist CVD apparatus 1 includes a carrier gas source 2a for supplying a carrier gas, a flow rate regulating valve 3a for regulating a flow rate of the carrier gas sent out from the carrier gas source 2a, a carrier gas (dilution) source 2b for supplying a carrier gas (dilution), a flow rate regulating valve 3b for regulating a flow rate of a carrier gas (dilution) sent out from the carrier gas (dilution) source 2b, a mist generating source 4 containing a raw material solution 4a, a container 5 containing water 5a, an ultrasonic vibrator 6 attached to a bottom surface of the container 5, a deposition chamber 7, a supply pipe 9 connecting the mist generating source 4 and the deposition chamber 7, a hot plate 8 installed in the deposition chamber 7, and a discharge port 11 for discharging mist, droplets, and exhaust gas after thermal reaction. A substrate 10 is placed on the hot plate 8.

1-2. Preparation of a Raw Material Solution

Tin bromide was mixed with an aqueous solution of gallium bromide of 0.1 mol to prepare an aqueous solution so that the atomic ratio of tin to gallium was 1:0.0008. At this time, hydrobromic acid was fed to the aqueous solution to be 20% by volume, and this was used as a raw material solution.

1-3. Preparation for Deposition

The raw material solution 4a obtained by the process of 1-2 was housed in the mist generating source 4. Next, an m-plane sapphire substrate with a non-doped α-$Ga_2O_3$ layer as a buffering layer formed on the surface thereof was placed on the hot plate 8 as the substrate 10, and the hot plate 8 was operated to raise the temperature in the deposition chamber 7 to 470° C. Next, the flow rate regulating valves 3a and 3b were opened, and a carrier gas was supplied from the carrier gas supply sources 2a and 2b serving as carrier gas sources into the deposition chamber 7, whereby the atmosphere in the deposition chamber 7 was sufficiently replaced with the carrier gas. Thereafter, the flow rate of the carrier gas and the flow rate of the carrier gas (dilution) were adjusted to 1.2 L/min and 1.0 L/min, respectively.

Here, nitrogen was used as the carrier gas.

1-4. Formation of a Crystalline Oxide Semiconductor Film

Next, the ultrasonic vibrator 6 was vibrated at 2.4 MHz, and the ultrasonic vibration was propagated to the raw material solution 4a through the water 5a, whereby the raw material solution 4a was atomized to generate mist 4b. The mist 4b was introduced into the deposition chamber 7 through the supply pipe 9 by the carrier gas. Then, the mist thermally reacted in the deposition chamber 7 under atmospheric pressure and at 615° C., and a film was deposited on the substrate 10. A deposition time was 6 hours.

1-5. Evaluation

The phase of the film obtained in the process 1-4 was identified using an X-ray diffractometer (XRD), and the obtained film was α-$Ga_2O_3$.

2. Formation of an $N^+$-type Semiconductor Layer

As a raw material solution, tin bromide was mixed with an aqueous solution of gallium bromide of 0.1 mol to prepare an aqueous solution so that the atomic ratio of tin to gallium was 1:0.24. At this time, hydrobromic acid was fed to the aqueous solution to be 20% by volume. A deposition time was 2 hours. Except for this condition, the crystalline oxide semiconductor film was formed in the same manner as in the process described in process 1. The phase of the obtained film was identified using an X-ray diffractometer (XRD), and the obtained film was α-$Ga_2O_3$.

3. Formation of Ohmic Electrodes

On the $n^+$-type semiconductor layer of the multilayer obtained by the process 2 above, Ti layer and Au layer was formed respectively by sputtering. The thickness of the Ti layer was 70 nm, and the thickness of the Au layer was 30 nm.

4. Removal of the Substrate

A temporary wafer (a temporary substrate) was temporarily bonded onto the ohmic electrodes of the multilayer obtained in the process 3. Next, the substrate 10 was polished using a grinder and a CMP (chemical mechanical polisher) apparatus to remove the sapphire substrate and the buffer layer.

5. Formation of an Insulating Film

By using plasma CVD, a $SiO_2$ film was formed on the $n^-$-type semiconducting layer of the multilayer obtained in the process 4. Thereafter, an opening was formed in the $SiO_2$ film by etching so as to expose a part of the $n^-$-type semiconductor layer.

6. Formation of Schottky Electrodes

On the $n^-$-type semiconductor layer of the multilayer obtained by the process 5, a Schottky electrodes were prepared by forming a Co film (thickness: 100 nm), Ti film (thickness: 50 nm) and Al film (thickness 5 μm) respectively using electron beam vapor deposition. Thereafter, unnecessary portions of the Co film, the Ti film and the Al film were removed by etching. By observing the outer edge portion of the obtained Schottky electrodes by SEM, it was confirmed that the Ti film and the Co film was overhanging outward the outer periphery of the Al film by about 10 μm, and that the outer edge portions of the Ti film and the Co film were located outside the outer edge portion of the Al film. The outer edge portions of the Ti film and the Co film were in contact with the $n^-$-type semiconductor layer. Sheet resistance of the Co film formed with the overhang was 1.3Ω.

Comparative Example 1

The Schottky electrode was formed so that the outer edges portion of the Al film, the Co film, and the Ti film were located on $SiO_2$ film, that is, the outer edge portion of the Al film as the second electrode layer were not electrically connected to the semiconducting layer, and the outer edge portions of the Al film, the Ti film, and the Co film were located at substantially the same positions. Except for this condition, an SBD was fabricated the same manner as in Example 1.

Example 2

The $n^-$-type semiconductor layer was formed using an aqueous solution of 0.1 mol gallium bromide containing hydrobromic acid at a volume ratio of 10% as a raw material solution. The Schottky electrodes were formed such that the Al film was electrically connected on the $n^-$-type semiconductor layer via the Co film and the Ti film, and the outer edge portions of the Co film and the Ti film were located on the $SiO_2$ film. Except for this condition, an SBD was fabricated in the same manner as in Example 1. When I-V measurement of the obtained SBD was carried out, it had an effect of decreasing leakage current equivalent to that of the SBD of Example 1.

(I-V Measurement)

Figure 9:
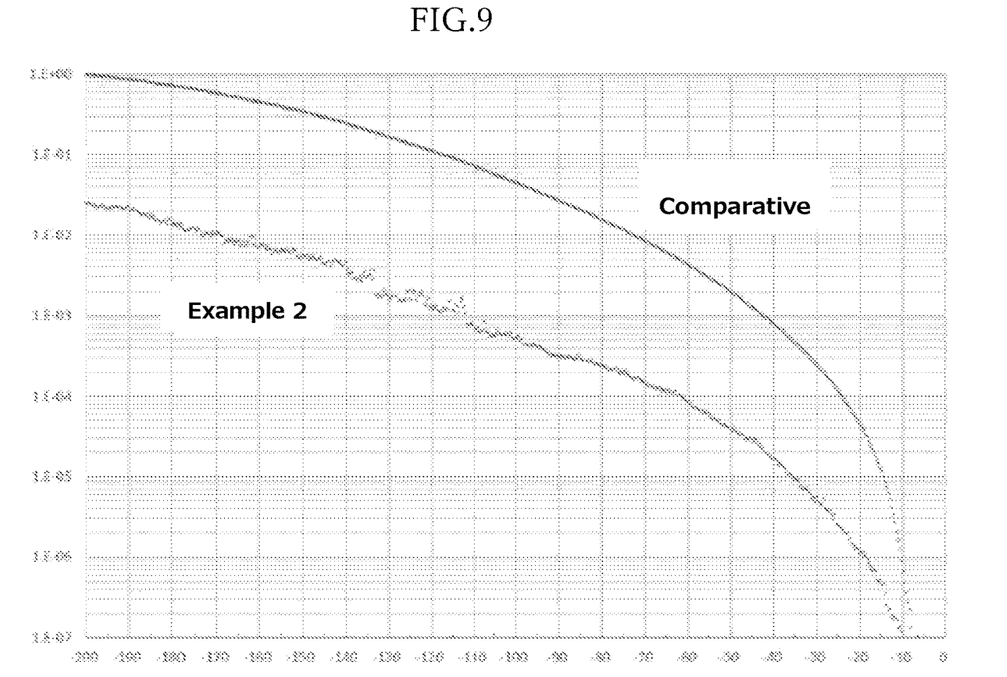
FIG. 9 is a graph illustrating results of I-V measurements in Examples and Comparative Examples, in which a vertical axis represents current and a horizontal axis represents voltage.

I-V measurement was performed for the SBDs obtained in Example 1, Comparative Example 1 and Example 2. The results for Example 2 and Comparative Example 1 are shown in FIG. 9. As is obvious from FIG. 9, it is understood that the leakage current of the SBD of Example 2 is greatly decreased as compared with the SBD of Comparative Example 1. The SBD of Example 1 also had an effect of suppressing leakage current as the SBD of Example 2.

INDUSTRIAL APPLICABILITY

The semiconductor device of the disclosure can be applied to products of various technical fields such as semiconductors (compound semiconductor electronic devices, etc.), electronic components and electrical equipment components, optical and electrophotographic related devices and industrial members. Among others, it is particularly useful for power devices.

DESCRIPTION OF SYMBOLS 1 deposition apparatus (mist CVD apparatus)
2a carrier gas source
2b carrier gas (diluent) source
3a flow rate regulating valve
3b flow rate regulating valve
4 mist generating source
4a raw material solution
4b mist
5 container 5a water
6 ultrasonic vibrator
7 deposition chamber
8 hot plate
9 supply pipe
10 substrate
101a n⁻-type semiconductor layer
101b n⁺-type semiconducting layer
102 ohmic electrode
103 Schottky electrode
103a metal layer
103b metal layer
103c metal layer
104 insulating film (field insulating film)
105 protective metal layer

The invention claimed is:

1. A semiconductor device comprising:
a semiconductor layer including an oxide semiconductor having a corundum structure as a main component; and
a Schottky electrode including a first electrode layer and a second electrode layer having a higher conductivity than the first electrode layer,
wherein an outer edge portion of the second electrode layer is electrically connected to the semiconductor layer at an electrical connection region through the first electrode layer, and an outer edge portion of the first electrode layer is located outside an outer edge portion of the electrical connection region, and
wherein at least a part of a portion of the first electrode layer protruding outward from the outer edge portion of the second electrode layer has a tapered region in which a thickness of the first electrode layer decreases toward an outer side of the semiconductor device.

2. The semiconductor device according to claim 1, wherein the oxide semiconductor contains at least one metal selected from aluminum, indium and gallium.

3. The semiconductor device according to claim 1, wherein the oxide semiconductor contains at least gallium.

4. The semiconductor device according to claim 1, wherein the first electrode layer contains at least one metal selected from Groups 4 to 10 of the Periodic Table.

5. The semiconductor device according to claim 1, wherein the first electrode layer contains at least one metal selected from Groups 4 and 9 of the Periodic Table.

6. The semiconductor device according to claim 1, wherein the first electrode layer includes at least two layers and wherein the two layers have different compositions from each other.

7. The semiconductor device according to claim 1, wherein the second electrode layer contains at least one metal selected from silver, copper, gold and aluminum.

8. The semiconductor device according to claim 1, wherein a thickness of the first electrode layer is thinner than a thickness of the second electrode layer.

9. The semiconductor device according to claim 1, further comprising a field insulating film on which the outer edge portion of the first electrode layer is located.

10. The semiconductor device according to claim 1, wherein the semiconductor device includes a Schottky barrier diode.

11. The semiconductor device according to claim 1, wherein the semiconductor device includes a power device.

12. A semiconductor system employing the semiconductor device according to claim 1.

* * * * *